(12) United States Patent
Chuang et al.

(10) Patent No.: US 6,344,415 B1
(45) Date of Patent: Feb. 5, 2002

(54) METHOD FOR FORMING A SHALLOW TRENCH ISOLATION STRUCTURE

(75) Inventors: Shu-Ya Chuang, Hsinchu Hsein; Aaron Lee, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/397,161

(22) Filed: Sep. 15, 1999

(51) Int. Cl.[7] .............................. H01L 21/302
(52) U.S. Cl. ................... 438/692; 438/690; 438/691; 438/700
(58) Field of Search .................. 438/690, 692, 438/693, 700

(56) References Cited

U.S. PATENT DOCUMENTS

| | | | |
|---|---|---|---|
| 5,837,612 A | * 11/1998 | Ajuria et al. | 438/697 |
| 5,843,820 A | * 12/1998 | Lu | 438/243 |
| 5,915,195 A | * 6/1999 | Fulford, Jr. et al. | 438/524 |
| 5,963,818 A | * 10/1999 | Kao et al. | 438/424 |
| 6,001,706 A | * 12/1999 | Tan et al. | 438/424 |
| 6,008,104 A | * 12/1999 | Schrems | 438/386 |
| 6,146,970 A | * 11/2000 | Witeck et al. | 438/424 |
| 6,207,494 B1 | * 3/2001 | Graimann et al. | 438/248 |

* cited by examiner

Primary Examiner—Benjamin L. Utech
Assistant Examiner—Charlotte A. Brown

(57) ABSTRACT

A method for forming a STI structure. A pad oxide layer is formed over a substrate. An amorphous silicon layer is formed over the pad oxide layer. A mask layer is formed over the amorphous silicon layer. The mask layer is patterned, and then the amorphous silicon layer, the pad oxide layer and the substrate are etched in sequence to form a trench. A thermal oxidation is performed to form a liner layer along the exposed sidewalls of the amorphous silicon layer and the exposed substrate surface inside the trench. Insulation material is deposited over the substrate, completely filling the trench. A chemical-mechanical polishing step is performed to remove a portion of the insulation layer and a portion of the mask layer so that an insulation plug is formed inside the trench. After the polishing step, the top surface of the insulation plug and the top surface of the mask layer are at the same surface. The mask layer is patterned to expose a portion of the amorphous silicon layer near the central region of two neighboring trenches. An ion implantation is carried out. The mask layer is removed. The amorphous silicon layer is removed.

18 Claims, 3 Drawing Sheets

METHOD FOR FORMING A SHALLOW TRENCH ISOLATION STRUCTURE

BACKGROUND OF THE INVENTION

1. Field of the Invention

The present invention relates to a method for forming a semiconductor device. More particularly, the present invention relates to a method for forming shallow trench isolation (STI) structures.

2. Description of the Related Art

Advances in the production of integrated circuits have led to an increase in the level of integration and the miniaturization of semiconductor devices. As the level of integration increases, both the dimensions of each device and size of the isolating structures between devices are reduced. Consequently, device isolation structures are increasingly harder to form. A device isolation structure such as a field oxide layer formed by local oxidation (LOCOS) is no longer suitable for small dimensional devices due to the intensification of bird's beak encroachment problem. Therefore, the shallow trench isolation (STI) method has been developed for highly integrated circuits, and, in particular, sub-half micron integrated circuits.

In general, a shallow trench isolation (STI) structure is formed by performing an anisotropic etching operation using a silicon nitride hard mask to form a steep-sided trench in a semiconductor substrate. Oxide material is next deposited into the trench to form an oxide plug. However, the aforementioned method of STI fabrication often results in the formation of recess cavities around the edge region of the oxide plug. The recess cavities often produce what is called a corner effect. For example, after the polysilicon gate is formed, the gate electrode field is partially increased. Often, this leads to an abnormal flow of subthreshold current in the transistor channel resulting in the intensification of kink effect. Hence, the transistor can no longer operate normally and reliably. Moreover, polysilicon stringers may form in the cavities causing unwanted connections and side effects.

SUMMARY OF THE INVENTION

Accordingly, one object of the present invention is to provide a method for forming a shallow trench isolation (STI) structure capable of preventing the formation of recess cavities around the corner area of the active region.

To achieve these and other advantages and in accordance with the purpose of the invention, as embodied and broadly described herein, the invention provides a method for forming a STI structure. A pad oxide layer is formed over a substrate. An amorphous silicon layer is formed over the pad oxide layer. A mask layer is formed over the amorphous silicon layer. The mask layer is patterned, and then the amorphous silicon layer, the pad oxide layer and the substrate are etched in sequence to form a trench. A thermal oxidation is carried out to form a liner layer along the exposed sidewalls of the amorphous silicon layer and the exposed substrate surface inside the trench. Insulation material is deposited over the substrate, completely filling the trench. A chemical-mechanical polishing step is carried out to remove a portion of the insulation layer and a portion of the mask layer so that an insulation plug is formed inside the trench. After the polishing step, the top surface of the insulation plug and the top surface of the mask layer are at the same surface. The mask layer is patterned to expose a portion of the amorphous silicon layer near the central region of two neighboring trenches. An ion implantation is carried out. The mask layer is removed. The amorphous silicon layer is removed.

The invention also provides an alternative method for forming a STI structure. A pad oxide layer, an amorphous silicon layer and a mask layer are sequentially formed over a substrate. The mask layer is patterned, and then the amorphous silicon layer, the pad oxide layer and the substrate are etched in sequence to form a trench. A thermal oxidation is carried out to form a liner layer along the exposed sidewalls of the amorphous silicon layer and the exposed substrate inside the trench. Insulation material is deposited over the substrate, completely filling the trench. A planarization step that retains a portion of the mask layer is carried out. The mask layer is patterned to expose a portion of the amorphous silicon layer near the central region of two neighboring trenches. An ion implantation is carried out. Finally, etching is carried out to remove the mask layer and the amorphous silicon layer above the pad oxide layer as well as a top layer of the insulation plug and the liner oxide layer in the active region.

Since etching selectivity between the amorphous silicon layer and the pad oxide layer is high, the pad oxide layer can serve as an etching stop layer for removing the mask layer and the amorphous silicon layer. The mask layer thus is completely removed without residue. A cop corner taper angle can be well controlled. Moreover, the amorphous silicon layer is formed between the mask layer and the pad oxide and while forming the pad oxide layer, the sidewall portion of the amorphous silicon layer is oxidized to form the sidewall oxide layer. The amorphous silicon layer and the sidewall oxide layer are able to protect the corner area of the active region when the mask layer is etched without exposing the corner area of the active region. In addition, the ion implantation is only performed on the device channel region, the capacity and electric field of the junction region of the source/drain region are decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
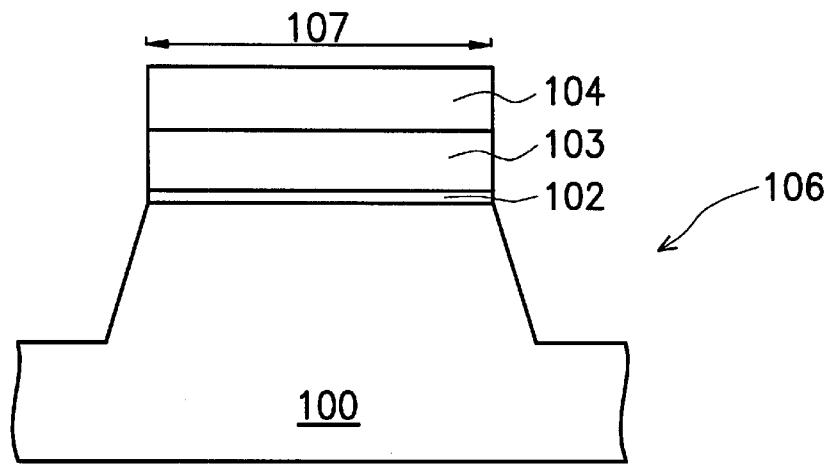
FIGS. 1A through 1G are schematic cross-sectional views showing the progression of manufacturing steps for producing a shallow trench isolation structure according to this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional view showing the progression of manufacturing steps for producing a shallow trench isolation structure according to this invention.

As shown in FIG. 1A, a pad oxide layer 102 is formed over a silicon substrate 100. The pad oxide layer 102 preferably having a thickness of about 100 Å protects the substrate 100 against the subsequent processing operation. In general, the pad oxide layer 102 is formed by thermal oxidation, and is removed before the subsequent deposition of a gate oxide layer. An amorphous silicon layer 103 having a thickness of about 500 Å to 1000 Å is formed over the pad oxide layer 102. A mask layer 104 such as a silicon nitride layer having a thickness of about 100 Å is formed over the amorphous silicon layer 103. Using photolithographic and etching processes, the mask layer 104 is patterned to expose a portion of the amorphous silicon layer 103. The amorphous silicon layer 103, the pad oxide layer 102 and the silicon substrate 100 are sequentially etched to form a trench 106 adjacent to an active region 107. Since the etching selectivity between the amorphous silicon layer 103 and the pad oxide layer 102 is high, the pad oxide layer 102 can serve as an etching stop layer for removing the mask layer 104 and the amorphous silicon layer 103 in a subsequent step.

Figure 1B:
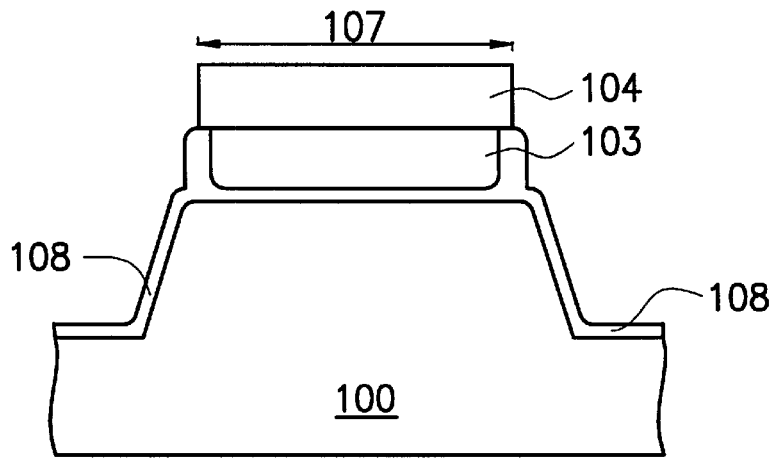

As shown in FIG. 1B, thermal oxidation is carried out to form a liner oxide layer 108 on the exposed sidewalls of the amorphous silicon layer 103 and the exposed substrate inside the trench 106.

Figure 1C:
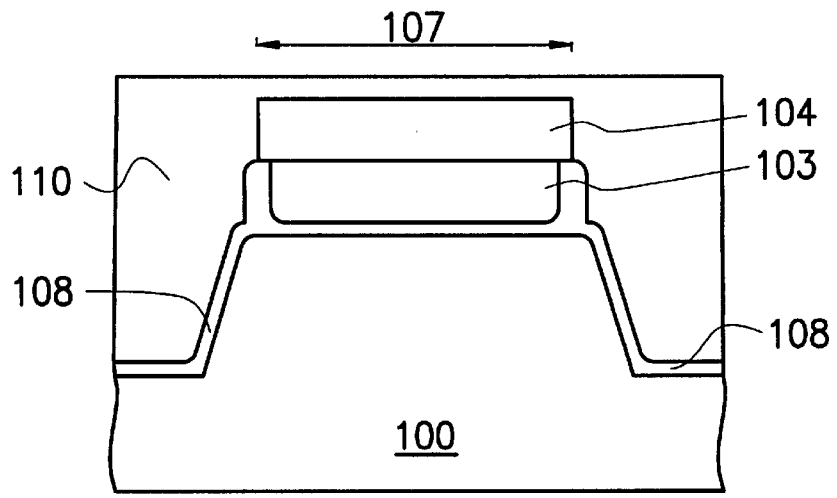
Figure 1D:
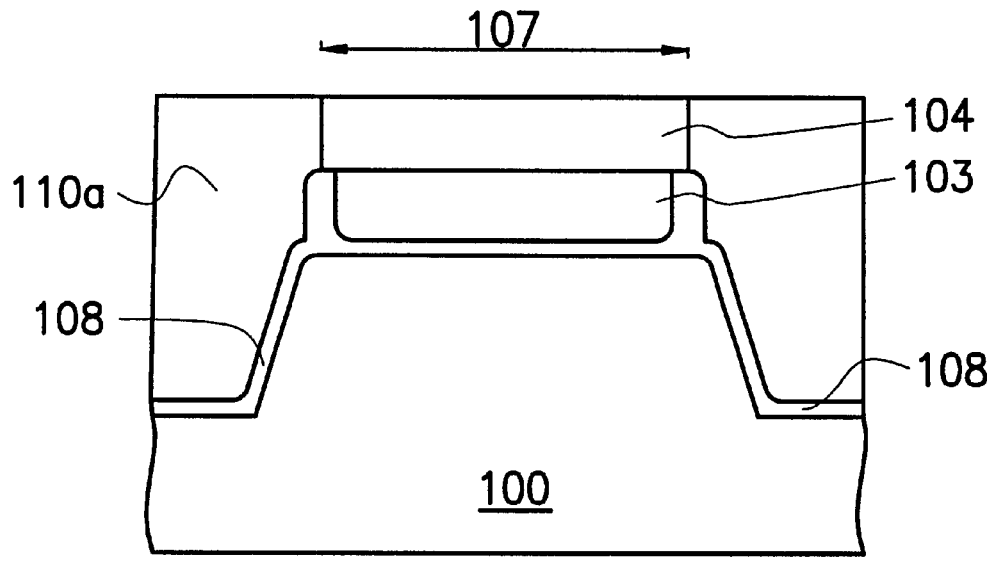

As shown in FIG. 1C, an insulation layer 110 that completely fills the trench 106 is formed over the mask layer 104. The insulation layer 110 can be an oxide layer formed by, for example, atmospheric pressure chemical vapor deposition (APCVD). The insulation layer 110 is densified to form a structurally finer and denser layer As shown in FIG. 1D, a planarization operation such as chemical-mechanical polishing (CMP) is carried out to remove the insulation layer 110 above the mask layer 104 and a portion of the mask layer 104. Ultimately, an insulation plug 110a is formed inside the trench 190.

Figure 1E:
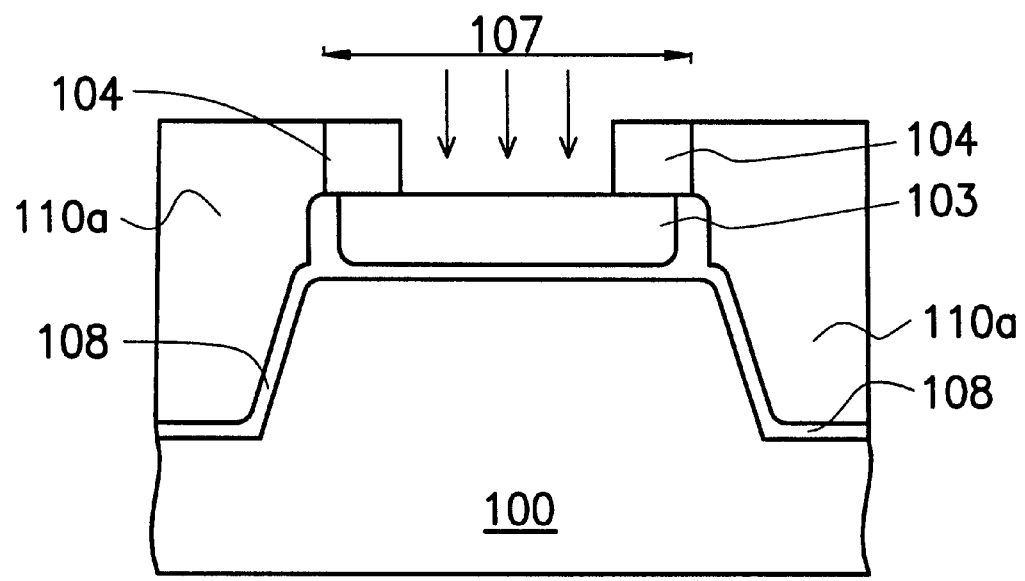

As shown in FIG. 1E, the mask layer 104 is patterned to expose a portion of the amorphous silicon layer 103 between two neighboring insulation plugs 110a by conventional photolithographic and etching processes. This exposed portion of the amorphous silicon layer 103 between two neighboring insulation plugs 110a is serving as a device channel region. The amorphous silicon layer 103 close to the liner oxide layer 108 is still covered by the mask layer 104. An ion implantation necessary for adjusting device parameters is carried out.

Figure 1F:
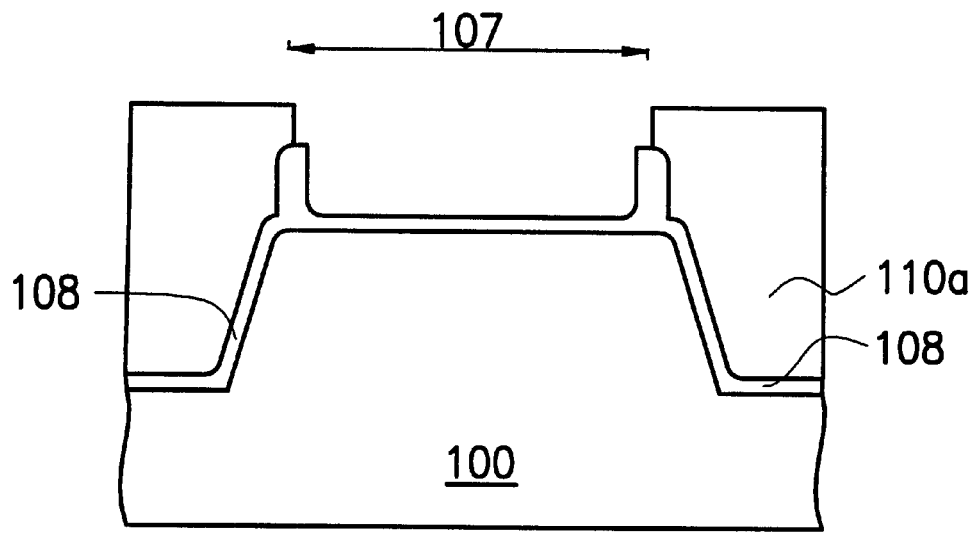

As shown in FIG. 1F, the mask layer 104 (shown in FIG. 1E) is removed by, for example, wet etching using hot phosphoric acid solution. The amorphous silicon layer (shown FIG. 1E) 103 is removed, for example, by dry etching.

Figure 1G:
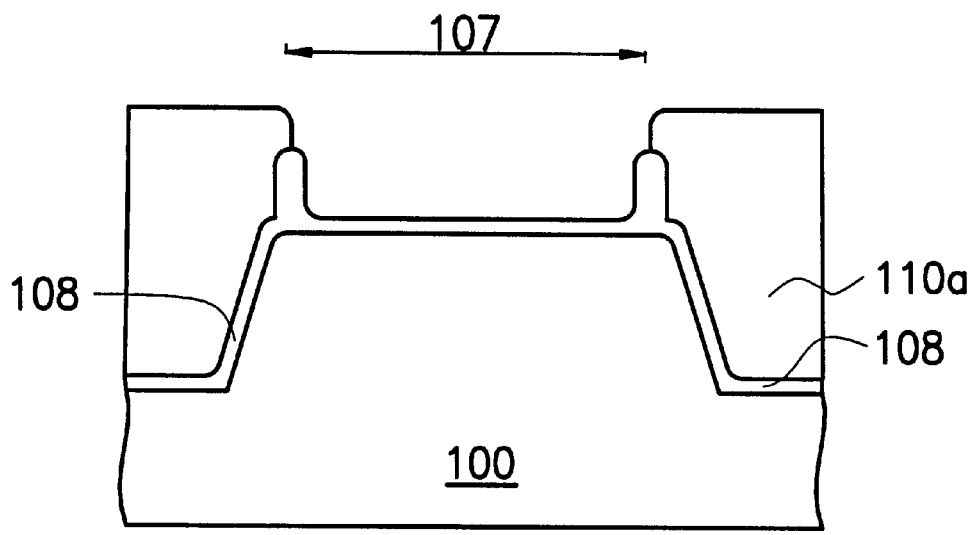

In FIG. 1G, while etching the mask layer 104 (shown in FIG. 1E), a surface layer of the insulation plug 110a and a sidewall portion of insulation plug 110a near the junction with the mask layer 104 are simultaneously removed. In addition, while removing the amorphous silicon layer (shown in FIG. 1E) 103, a sidewall portion of the liner oxide layer 108 next to the amorphous silicon layer 103 and a portion of the exposed insulation plug 110a are removed. A resultant structure is shown in FIG. 1G.

In the subsequent step, other operations necessary for fabricating the shallow trench isolated semiconductor devices such as the removal of pad oxide layer, formation and removing of a sacrificial oxide layer, formation of a gate oxide layer and so on are carried out.

In summary, advantages of this invention include:
1. Since etching selectivity between the amorphous silicon layer and the pad oxide layer is high, the pad oxide layer can serve as an etching stop layer while removing the mask layer and the amorphous silicon layer. The mask layer thus is completely removed without residue. The cop corner taper angle can be well controlled by changing etch recipe after breaking through pad oxide.
2. An amorphous silicon layer is formed between the mask layer and the pad oxide and while forming a liner oxide layer, the sidewall portion of the amorphous silicon layer is oxidized to form a sidewall oxide layer. The amorphous silicon layer and the sidewall oxide layer are able to protect the corner area of the active region when the mask layer is etched without exposing the corner area of the active region.
3. The ion implantation is only performed on the device channel region, the capacity and electric field of the junction region of the source/drain region are decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming shallow trench isolation structure, comprising the steps of:

providing a substrate;

forming a pad oxide layer over the substrate;

forming an amorphous silicon layer over the pad oxide layer;

forming a mask layer over the amorphous silicon layer;

patterning the mask layer, the amorphous silicon layer, the pad oxide layer and the substrate to form a trench and an active region;

performing an oxidation to form a liner oxide layer on exposed sidewalls of the amorphous silicon layer and an exposed substrate surface inside the trench, wherein the mask layer serves as a protection layer on a top surface of the amorphous silicon layer;

depositing insulation material into the trench and over the substrate to form an insulation layer;

performing chemical-mechanical polishing to remove a portion of the insulation layer and a portion of the mask layer and retaining an insulation plug inside the trench such that a top surface of the insulation plug and a top surface of the mask layer are at the same level;

patterning the mask layer to expose a portion of the amorphous silicon layer between two neighboring insulation plugs;

performing an ion implantation;

removing the mask layer; and removing the amorphous layer.

2. The method of claim 1, wherein the pad oxide layer has a thickness of about 100 Å.

3. The method of claim 1, wherein the amorphous silicon layer has a thickness of about 500 Å to 1000 Å.

4. The method of claim 1, wherein the mask layer has a thickness of about 1000 Å.

5. The method of claim 1, wherein the step of forming the insulation layer includes depositing oxide.

6. The method of claim 1, wherein the step of forming the insulation layer includes atmospheric pressure chemical vapor deposition.

7. The method of claim 1, wherein the step of removing the mask layer includes wet etching.

8. The method of claim 1, wherein the step of removing the amorphous silicon layer includes dry etching.

9. A method for forming shallow trench isolation structure, comprising the steps of:

providing a substrate;

sequentially forming a pad oxide layer, an amorphous silicon layer and a mask layer over the substrate;

patterning the mask layer, the amorphous silicon layer, the pad oxide layer and the substrate to form a trench and an active region;

performing an oxidation to form a liner oxide layer on exposed sidewalls of the amorphous silicon layer and an exposed substrate surface inside the trench, wherein the mask layer serves as a protection layer on a top surface of the amorphous silicon layer;

depositing insulation material into the trench and over the substrate to form an insulation layer;

performing a planarization operation that retains a portion of the mask layer;

patterning the mask layer to expose a portion of the amorphous silicon layer between two neighboring insulation plugs;

performing an ion implantation;

performing a first etching step to remove the mask layer over the amorphous silicon layer; and performing a second etching step to remove a surface layer of the amorphous silicon layer and the liner oxide layer above the active region.

10. The method of claim 9, wherein the pad oxide layer has a thickness of about 100 Å.

11. The method of claim 9, wherein the amorphous silicon layer has a thickness of about 500 Å to 1000 Å.

12. The method of claim 9, wherein the mask layer has a thickness of about 1000 Å.

13. The method of claim 9, wherein the step of forming the insulation layer includes depositing oxide.

14. The method of claim 9, wherein the step of forming the insulation layer includes atmospheric pressure chemical vapor deposition.

15. The method of claim 9, wherein the step of performing the planarization includes chemical-mechanical polishing.

16. The method of claim 9, wherein the step of forming the mask layer includes depositing silicon nitride.

17. The method of claim 9, wherein the first etching step includes wet etching.

18. The method of claim 9, wherein the second etching step includes dry etching.

* * * * *